United States Patent
Fest et al.

(10) Patent No.: US 10,222,405 B2
(45) Date of Patent: Mar. 5, 2019

(54) SOLID STATE ANALOG METER

(71) Applicant: Otto P. Fest, Tucson, AZ (US)

(72) Inventors: Otto P. Fest, Tucson, AZ (US); Noel Smith, Tucson, AZ (US); Andreko Lennartz, Tucson, AZ (US)

(*) Notice: Subject to any disclaimer, the term of this patent is extended or adjusted under 35 U.S.C. 154(b) by 0 days.

(21) Appl. No.: 15/973,291

(22) Filed: May 7, 2018

(65) Prior Publication Data

US 2018/0364288 A1  Dec. 20, 2018

Related U.S. Application Data

(60) Provisional application No. 62/603,856, filed on Jun. 14, 2017.

(51) Int. Cl.
   *G08B 5/22*  (2006.01)
   *G01R 22/06*  (2006.01)
   *G09G 3/14*  (2006.01)

(52) U.S. Cl.
   CPC ........... *G01R 22/066* (2013.01); *G09G 3/14* (2013.01)

(58) Field of Classification Search
   None
   See application file for complete search history.

(56) References Cited

U.S. PATENT DOCUMENTS

| | | |
|---|---|---|
| 6,285,094 B1 | 9/2001 | Fest |
| 7,477,080 B1 | 1/2009 | Fest |
| 7,626,378 B1 | 12/2009 | Fest |
| 7,684,768 B1 | 3/2010 | Fest et al. |
| 9,054,725 B1 | 6/2015 | Fest et al. |
| 2016/0165689 A1* | 6/2016 | Li ..................... H05B 33/0887 315/210 |

* cited by examiner

*Primary Examiner* — Julie B Lieu

(57) ABSTRACT

A solid state analog device resistant to cyber security hacking is described herein. In one example, the device may include a signal input circuit, a comparator and driver circuit, and a display. The signal input circuit may be configured to detect loss of the input signal and the comparator and driver circuit may be configured to generate a voltage output and a reference power supply voltage from the input signal, wherein the comparator and driver circuit provides for a hardware-only design of the solid state analog device without digital assets, thus reducing cyber security hacking risks of the solid state analog device.

10 Claims, 6 Drawing Sheets
(2 of 6 Drawing Sheet(s) Filed in Color)

SOLID STATE ANALOG METER

CROSS REFERENCE

This application claims priority to U.S. Provisional Patent Application No. 62/603,856, filed Jun. 14, 2017, the specification(s) of which is/are incorporated herein in their entirety by reference.

FIELD OF THE INVENTION

The present invention relates to solid state analog meters and, more particularly, to hardware-only self-powered current loop meters capable of measuring and displaying AC and DC signals.

BACKGROUND OF THE INVENTION

Analog meters used in power industries are simple to install, use, and have low manufacturing costs but have many limitations that include shock, wear, magnetic sensitivity, unreliability, and fragility. In addition, analog meters tend to have stuck needles, and suffer from inaccurate measurements, and erroneous readings by operators.

Various attempts have been made to address the limitations of the analog meters. One example approach is shown by Fest et. al. in U.S. Pat. No. 9,054,725. Therein, meters having digital asset componentry or microcontroller is shown. The microcontroller measures an input signal from an input current loop and transmits an output signal to a desired output current loop, without requiring external power other than the one already existing in the current loop. In addition, the microcontroller reports instrument status and loss of signal to eliminate operator error in assuming the meter is faulty when in actuality a loss of signal has occurred. However, the controllers are targets for criminal hacking. Hence, there is a need, particularly in the nuclear industry, for a digital meter that is compliant with cyber security requirements.

SUMMARY OF THE INVENTION

The present invention provides for an expansion of loop powered technology preferred but not limited to 4-20 mA current loop, using a hardware-only design. The invention provides for extracting energy from current loops for use in displays, alarms, controls, and communication and reporting of instrument status and loss of signal to eliminate operator error in assuming the meter is faulty when in actuality a loss of signal has occurred. The present art shows advances over current technology, such as higher efficiency devices requiring less energy as well as certain governmental regulations restricting or eliminating the use of what has been defined as "digital assets" also known as programmable semiconductors (microcontrollers) subject to criminal hacking also known as Cyber Security vulnerable.

In some aspects, the present invention discloses a solid state analog device resistant to cyber security hacking. As will be disclosed herein, the solid state analog device may include a signal input circuit configured to generate a voltage output and a reference power supply voltage ("Vcc") from an input signal, the signal input circuit configured to detect loss of the input signal, wherein the input signal is generated by a signal source coupled to the solid state analog device.

The solid state analog device may additionally include a comparator and driver circuit and a display for displaying the signal strength via the plurality of LEDs. In some embodiments, the comparator and driver circuit may include a first comparator and a driver. The first comparator may be configured to receive the voltage output and compare the voltage output with the Vcc across a plurality of light emitting diodes ("LEDs"). The plurality of LEDs may be driven by the driver. The comparing may result in turning ON a number of LEDs of the plurality of LEDs, the number based on a strength of the input signal, and wherein a time the number of LEDs remain ON is determined by a duty cycle set by an oscillator coupled to the driver thereby generating an intensity control. The comparator and driver circuit may provide for a hardware-only design of the solid state analog device without digital asset thus reducing cyber security hacking risks.

In some embodiments, the signal input circuit may comprise an inductor coupled to the input signal, configured for bidirectional noise protection, a solar cell coupled to a first diode, a first supercapacitor, and a pilot light. In some embodiments, the solar cell may be configured to drive a pilot light when the input signal is below a threshold, and wherein the solar cells may be further configured to charge the first supercapacitor through the first diode. The first supercapacitor may be configured to receive energy from the solar cell and store the energy, wherein the energy stored in the first supercapacitor may be configured to drive the pilot light when the input signal fails. The first diode may block the energy stored in the first supercapacitor to be discharged through the solar cell.

In some embodiments, the signal input circuit may comprise an amplifier configured to convert the input signal to the voltage output configured to drive the comparator and driver circuit. In some embodiments, the signal input circuit may further comprise a first resistor coupled to the first supercapacitor configured to provide additional charge to the supercapacitor. The signal input circuit may additionally include a second diode coupled to the inductor and the resistor. The second diode may be configured to block the energy stored in the first supercapacitor to be discharged through the signal source. The signal input circuit may include a voltage regulator coupled in parallel to a capacitor, the voltage regulator may be configured to shunt the signal input, wherein the capacitor is configured to filter the signal input. The signal input circuit may include a second resistor coupled to a third resistor, wherein a voltage developed at a junction of the second resistor and the third resistor may become a negative signal input to the amplifier.

In some embodiments, the driver may comprise multiple decade drivers, each decade driver configured to a decade of LEDs, wherein the plurality of LEDs may be divided into groups of ten LEDs forming the decade. In some embodiments, a number of decade drivers and a number of LEDs used is determined based on the time that the LEDs are ON and a visual light retention capability. In some embodiments, the plurality of LEDs may be white LEDs coupled to colored transparent filters effective for generating a color display.

In some embodiments, the display may further include a numerical section coupled to a numerical display driver circuit. The numerical display driver circuit may be configured to automatically detect signal loss and provide an indication to a user and increase an ON time of the pilot light when signal loss occurs. In some embodiments, the numerical display driver circuit may comprise a second comparator configured to receive the signal input from the signal source and compare the signal input to a reference voltage ("VREF"), a field effect transistor ("FET") coupled to the second comparator; and an analog to digital (A/D) convertor coupled to a numerical display.

In some embodiments, the second comparator may activate the FET responsive to the signal input being lower than the VREF, wherein the activation of the FET may effectively disable the VREF input to the A/D converter thereby display an error message on the numerical display to intimate a user of the signal loss.

According to some embodiments, a signal fail detection circuit configured to detect loss of signal from a signal source coupled to a solid state analog meter is provided. The signal fail detection circuit may include an inductor coupled to the input signal, configured for bidirectional noise protection, a solar cell coupled to a first diode, a first supercapacitor, and a pilot light, the solar cell configured to drive a pilot light when the input signal is below a threshold, and wherein the solar cells is further configured to charge the first supercapacitor through the first diode.

In some embodiments, the first supercapacitor may be configured to receive energy from the solar cell and store the energy, wherein the energy stored in the first supercapacitor is configured to drive the pilot light when the input signal fails, wherein the first diode blocks the energy stored in the first supercapacitor to be discharged through the solar cell. In some embodiments, the signal fail detection circuit may include an amplifier configured to convert the input signal to the voltage output configured to drive a comparator and driver circuit of the solid state analog meter.

In some embodiments, the signal fail detection circuit may further include a first resistor coupled to the first supercapacitor configured to provide additional charge to the supercapacitor, and a second diode coupled to the inductor and the resistor, the second diode configured block the energy stored in the first supercapacitor to be discharged through the signal source. In some embodiments, the signal fail detection circuit may additionally include a voltage regulator coupled in parallel to a capacitor, the voltage regulator configured to shunt the signal input, wherein the capacitor is configured to filter the signal input; and a second resistor coupled to a third resistor, wherein a voltage developed at a junction of the second resistor and the third resistor becomes a negative signal input to the amplifier.

In some embodiments, a numerical display driver circuit (400) of the solid state analog meter may be coupled to the signal fail detection circuit. The numerical display driver circuit may be configured to automatically detect signal loss and provide an indication to a user and increase an ON time of the pilot light when signal loss occurs.

In some embodiments, the numerical display driver circuit may include a comparator configured to receive the signal input from the signal source and compare the signal input to a reference voltage ("VREF"), a field effect transistor ("FET") coupled to the second comparator, and an analog to digital (A/D) convertor coupled to a numerical display. The second comparator may enable the FET responsive to the signal input being lower than the VREF, wherein the enabling of the FET may effectively short the VREF input of the A/D converter to ground, thereby display an error message on the numerical display to intimate the signal loss.

In some embodiments, the numerical display driver circuit may be further configured to increase an ON time of the pilot light during the signal loss by delaying a power supplied to the A/D converter via a transistor, wherein the transistor is coupled to a second supercapacitor, and the second supercapacitor is configured to drive the pilot light for a longer time thereby increasing the ON time of the pilot light during the signal loss.

According to some embodiments, a hardware-only comparator and driver circuit of a solid state analog meter configured to provide an intensity control of a LED display of the meter is provided. Herein, the LED display may include a plurality of LEDs. The circuit may include a plurality of comparators coupled to the plurality of LEDs, wherein each comparator receives a voltage output of a signal detection circuit of the meter and compares the voltage output with a reference voltage to turn ON a sequence of LEDs based on the comparison. The circuit may additionally include a decade driver coupled to the plurality of LEDs, wherein the plurality of LEDs is divided into decades of LEDs, and each decade output of the decade driving a decade of LEDs; and transistors coupling each decade output to the diode configured to adjust the reference voltage.

In some embodiments, the circuit may additionally include an oscillator clock coupled to the decade driver and a potentiometer coupled to the oscillator clock, wherein a time for which a LED of the plurality of LEDs remains ON is determined by a duty cycle of the oscillator, wherein the duty cycle is set by the potentiometer, wherein hardware-only design of the circuit reduces vulnerability of the circuit to cyber-attacks or hacking.

In some embodiments, the signal detection circuit may be configured to generate the voltage output from an input signal generated by a signal source coupled to the solid state analog meter. In some embodiments, the signal detection circuit may be further configured to detect loss of the input signal and display an error to a user intimating the user of signal loss. In some embodiments, the reference voltage may be an adjustable voltage adjusted by a diode coupled to the plurality of comparators, wherein the comparison of the voltage output with the adjustable voltage results in the intensity control of the plurality of LEDs. In some embodiments, the plurality of LEDs may be white LEDs coupled to colored transparent filters effective for generating a color display.

The present invention overcomes all the limitations of the analog meter. The elimination of digital componentry is a way to prevent criminal hacking and to comply with the Nuclear Regulatory Commission Regulation NEI 08-09 (and others) which enforces plant cyber security. The present invention is not limited to nuclear power plants use since it can be used in any environment where cyber security protection or just plain replacement of analog meters is desired.

The present art includes innovations in signal conditioning of several sources with the goal to replace obsolete and unreliable analog meters technology of the 18th century used in vulnerable applications such as Military, Nuclear Gas & Petrochemical industries where safety and reliability is paramount. The analog representation of the signal using a segmented bar is used for traditional analog meter representation simulating the "needle" for better Human-machine interface enhanced by the use of numerals for high accuracy and error free reading of the data.

All is accomplished without the use of devices that require Firmware or Software subject to criminal breach. The hardware only design, of the present invention, meets strict requirements of the industry to reliably and accurately operate within the present limited power available to analog meters technology such as 1-5 and mainly 4-20 mA current loops as well as alternating current known as household power and direct current used in industrial applications, just like present analog meters do and also externally powered meters used for sub-microwatt applications. These new features are improvements over U.S. Pat. No. 9,054,725 granted to inventor of present invention by a factor of four (4) from 4 to 1 mA.

One of the unique and inventive technical features of the present invention is the loop powered technology which allows the solid state analog meter of the present invention to utilize the "input signal failure" and to accept positive or negative signals and to power the 100 segment bargraph and numerical sections of the meter using the lower energy levels of the signal. Without wishing to limit the invention to any theory or mechanism, it is believed that the technical feature of the present invention advantageously uses about 70% less energy from 10 mW (milli-Watts) to under 3 mW, for either the digital or bargraph sections, allowing operation from low level signal transducers or AC/DC signals. None of the presently known prior references or work has the unique inventive technical feature of the present invention.

The present invention eliminates the need for microcontrollers or similar configurable (programmable) devices to control the operation of the meter. The present invention minimizes and surpasses the typical operation of an analog meter by replacing all the electro-mechanical parts with solid-state technology, without the detriment of having to supply external power to operate. The solid state analog meter of the present invention can be used for AC/DC, Volts/Amp, (1-5, 4-20 & 10-50) mA current loops, and others, and eliminates fragile and unreliable electro-mechanical movement of analog meters whose fragility is known to cause wear and tear of the mechanism, leading to failures and inaccuracies. For example, one universal failure of the analog meter is the "stuck needle." That is known to be the cause of numerous tragedies.

Systems using the loop powered controllers need to be kept cyber secure. For example, a nuclear power plant I & C (Instrument & Control) room would now have to comply with the Nuclear Regulatory Commission's cyber-security regulations (NEI 08-09, et. al.). To get past these hurdles, a power plant could conceivably spend millions of dollars and wait years before the upgrades are completed. Digital meter technology that could offer a 100% compatible (1:1) analog replacement just did not exist, until now.

The present invention discloses a new breed of digital meter known as SSAM (which stands for Solid State Analog Meter). SSAM is hardware only (no microprocessor) multicolor bar-digital meter that is solely powered by a 4-20 mA (~5-60 mW) current loop (typical to most I & C rooms). In fact, it can be powered by any signal that can provide >5 mW of energy, even if no other power or current is available. This Powerless TM meter can be used as a basic bar graph (like the analog meter), as a bar-digital (like old digitals), or as a multi-function meter which can be configured in the field by the user. SSAM will measure, display, control, and transmit AC and/or DC signals without a microprocessor and all with a +/−0.5% digital accuracy. Since the SSAM has no uP, readout colors are achieved by embedding colored filters into the scale plate which cover the units high-efficiency, pure white LEDs.

Analog meters, invented 120 years ago by Sir E. Weston) have done a great service to humanity, but have many limitations (shock, wear, position, magnetic sensitive, interpretation inaccuracy, etc.). SSAM of the present invention may well be the end of the old analog meter since SSAM can be installed using the existing input signals, wires and panel cut-outs as the old analog meters. In addition, since SSAM contains no microprocessors, it is not subject to regulatory cyber security compliance conditions. The total cost to upgrade to SSAM's more efficient digital technology would be about ⅓ of replacing obsolete analog/digitals, and these units will pay for themselves within a week (assuming a 1% increase in efficiency).

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

BRIEF DESCRIPTION OF THE DRAWINGS

This patent application contains at least one drawing executed in color. Copies of this patent or patent application publication with color drawing(s) will be provided by the Office upon request and payment of the necessary fee.

The features and advantages of the present invention will become apparent from a consideration of the following detailed description presented in connection with the accompanying drawings in which.

DESCRIPTION OF PREFERRED EMBODIMENTS

Figure 1:
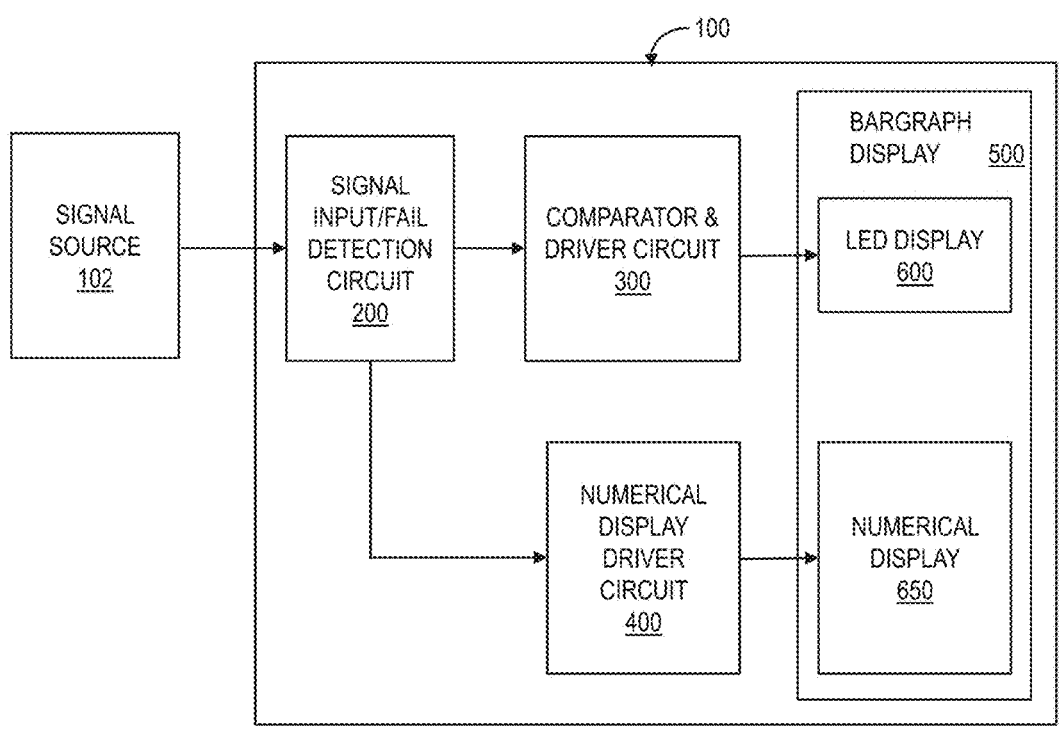
FIG. 1 depicts a schematic diagram of a hardware-only solid state analog meter having a signal input circuit, a counter, and a display, according to an embodiment of the present invention.

Following is a list of elements corresponding to a particular element referred to herein:
10 terminal
12 terminal
14 inductor
16 second diode
18 first resistor
20 first diode
22 solar cell
24 first supercapacitor
28 pilot light or signal fail LED
30 voltage regulator
32 capacitor
34 second resistor
36 third resistor
38 resistor
40 resistor
42 resistor
44 resistor
46 amplifier
48 block
50 oscillator
52 potentiometer
54 driver
56 light emitting diodes (LEDs)
58 comparator
60 diode
62 transistors 70 numerical display
72 A/D converter
74 transistor
76 capacitor
78 field effect transistor (FET)
80 second comparator
82 second supercapacitor
84, 86 resistors
100 solid state analog meter or device
102 signal source
200 signal input/fail detection circuit
300 comparator and driver circuit
400 numerical display driver circuit
500 display
600 LED color display
650 numerical display Referring now to FIG. 1-6B, the present invention features a hardware only design of a solid state power meter. FIG. 1 shows a schematic diagram of the solid state analog meter (100), which includes a signal input circuit (200), a comparator and driver circuit (300), and a display (500). Specifically, the solid state analog meter (100) includes hardware-only (no microprocessor or digital asset components, for example) components that control the operation of the meter (100). The meter (100) not only surpasses the typical operation of an analog meter by replacing all the electro-mechanical parts with solid-state technology, but also accomplishes this without any microprocessor. The elimination of digital componentry is a way to reduce criminal hacking and to comply with the Nuclear Regulatory Commission Regulation NEI 08-09 (and others) which enforces plant cyber security. The present invention is not limited to nuclear power plants use since it can be used in any environment where cyber security protection or just plain replacement of analog meters is desired. As other non-limiting examples, the meter (100) may be used for AC/DC, Volts/Amp, (1-5, 4-20 & 10-50) mA current loops, and others, and eliminates the fragile and unreliable electro-mechanical movement of analog meters whose fragility is known to cause wear and tear of the mechanism, leading to failures and inaccuracies.

Figure 2:
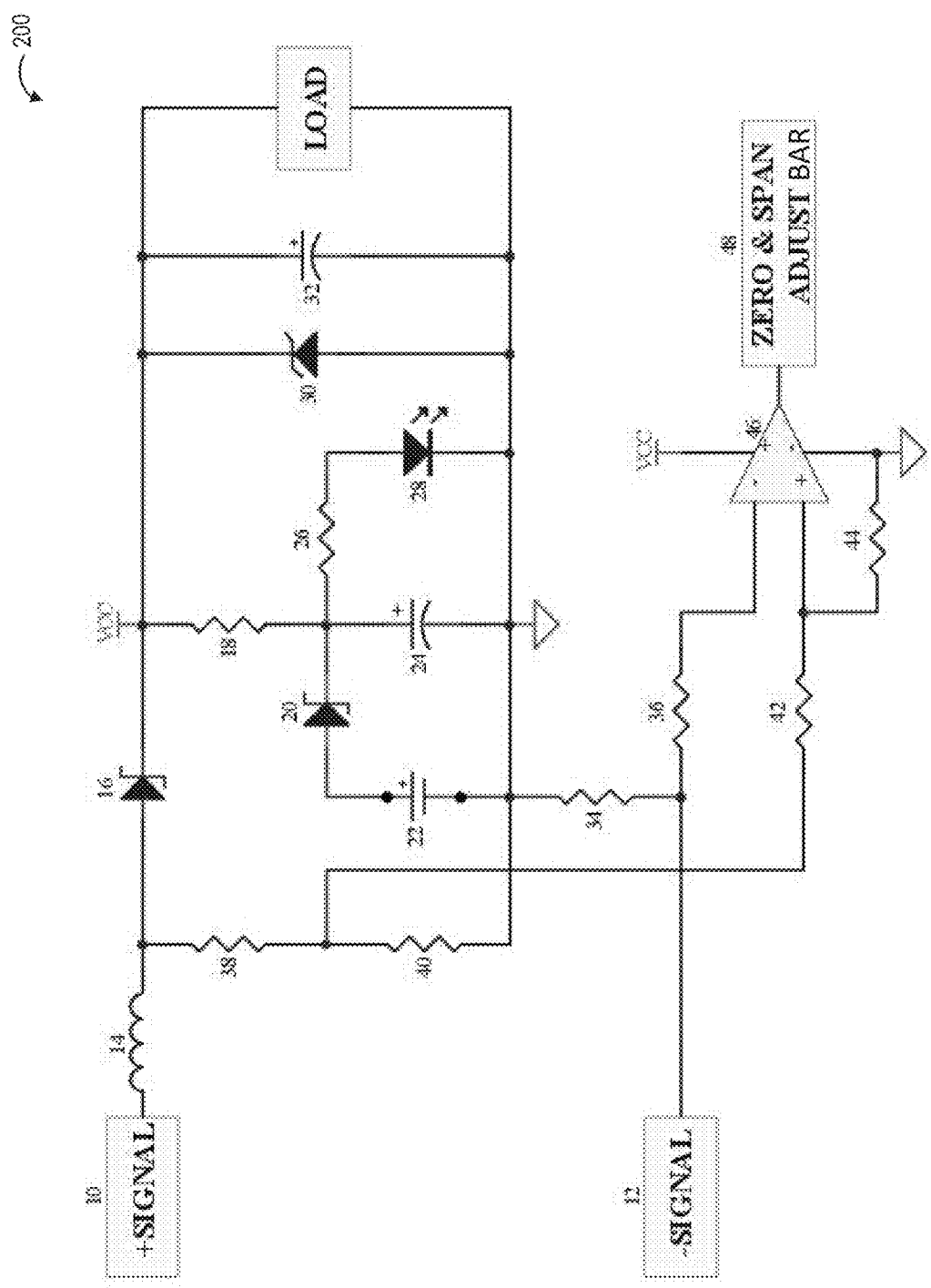
FIG. 2 shows the signal input circuit.

The signal input circuit (200) receives an input signal that is generated by a signal source (102). Turning now to FIG. 2, the signal input circuit (200) is shown. Herein, the signal input circuit (200) is configured to generate a voltage output and a reference power supply voltage ("Vcc") from the input signal from the signal source (102). In addition, the signal input circuit (200) is configured to detect loss of the input signal, as described below.

The most positive voltage of the input signal is applied at terminal 10 and the most negative voltage of the input signal is applied at terminal 12. The +signal (10) and −signal (12) of the input signal is applied to an inductor (14). The inductor (14) provides bidirectional noise protection. The inductor (14) prevents spurious input signals (e.g., noise) from affecting the circuit and additionally prevents spurious input signals from transferring to and affecting other external equipment that are coupled to the meter.

The signal input circuit (200) comprises a solar cell (22) coupled to each of a diode (20), a supercapacitor (24), and a pilot light (28). As such, the solar cell (22) is configured to drive a pilot light (28) when the input signal is below a threshold. In addition, the solar cell (22) is configured to charge the supercapacitor (24) through the diode (20). The supercapacitor (24) receives energy from the solar cell (24) and stores the energy, wherein the energy stored in the first supercapacitor (24) is used to drive the pilot light (28) when the input signal fails, for example. The diode (20) blocks the energy stored in the supercapacitor (24) to be discharged through the solar cell (22).

The signal input circuit (200) additionally includes a resistor (18) coupled to the supercapacitor (24). Herein, the resistor (18) provides additional charge to the supercapacitor (24). The signal input circuit (200) includes a diode (16) coupled to the inductor (14) and the first resistor (18). Herein, the diode (20) may be referred to as a first diode and the diode (16) may be referred to as a second diode. The second diode (16) blocks the energy stored in the supercapacitor (24) to be discharged through the signal source (102). More specifically, if an absence in input signal is caused by a short, the diode (16) would prevent the energy stored in the supercapacitor (24) from discharging into the signal source.

In summary, the solar cell (22) is used to increase the energy necessary to charge the supercapacitor (24) thru the diode (20). In addition to aiding in charging the supercapacitor (24), the diode (20) also prevents discharge of the supercapacitor (24) thru the solar cell (22). The charge stored in the solar cell (22) is used to energize and signal fail LED (28). Resistor (18) is also used to the charge supercapacitor (24) in conjunction with the solar cell (22) if there is a signal fail. Herein, when the signal fails, there is no external energy to light up the LED (28), and hence the charge from the solar cell (22) and/or supercapacitor (24) is used to maintain the signal fail led (28) lit. In this way, when there is a loss of input signal, the meter warns the user about the loss by lighting up the LED (28). The diode (16) coupled to the inductor (14) and the supercapacitor (24) prevents the energy stored in the super capacitor (24) from discharging into the signal source.

The signal input circuit includes a voltage regulator (30) coupled in parallel to a capacitor (32). The voltage regulator (30) shunts the input signal, wherein the capacitor (32) is configured to filter the signal input. The signal input circuit (200) additionally includes a resistor (34) coupled to another resistor (36), wherein a voltage developed at a junction of the resistors (34) and (36) becomes a negative signal input to an amplifier (46). Herein, the amplifier (46) of the signal input circuit (200) is configured to convert the input signal to the voltage output configured to drive the comparator and driver circuit (300).

Thus, the voltage regulator (30) shunts the current input signal and converts it to voltage typically (but not limited) 1-5 or 4-20 or 10-50 milliamps (mA) current loop, and capacitor 32 is used as a typical filter. The total current of the loop is summed at the junctions of resistor (34) and the above mentioned components to assure no loss of signal integrity and is also used as the circuitry zero (0) volts or system ground, therefore the voltage developed across resistor (34) and its junction of resistor (36) becomes the negative signal used by amplifier (46) to convert it to positive and be the signal to be measured after proper adjustments for zero and span via potentiometers & follower amplifier in block 48.

The above is true for signal power applications, for externally powered applications which have a variable amplitude and referenced to system ground, amplifier (46) is changed to a non-inverting mode by shorting out (0 Ohms) resistor (34) eliminating resistor (44) and using resistor (42) to route the +input signal from the junction of resistors 38 & 40 to amplifier (46). The result is a signal powered, automatic polarity conversion from negative to positive without the use of traditional differential amplifier and DC-DC converters and the added capability of increased time of operation of the alarming function of led (28) which is powered by 3 sources: (1) the signal thru resistor (18) or (2) the super capacitor (24) or (3) the solar cell (22).

The signal input circuit (200) serves two functions: a) converts the current to voltage to power the bargraph & digital sections or both and b) stores the excess energy to use as a power source after the signal has failed. This stored energy allows the meter to alarm the operator of the signal failure. If the meter has voltage instead of current (positive or negative inputs), amplifier (46) via its selectable resistors 42 & 44 it can operate as unipolar without further changes and passes the input signal to external plug-in modules to allow the meter (and user) to add other functions in series such as: alarms (U.S. Pat. No. 6,285,094) isolated 4-20 mA retransmission (U.S. Pat. No. 7,684,768), loop powered isolator (U.S. Pat. No. 7,477,080), and AC Amps input signal powered (U.S. Pat. No. 7,626,378) isolated serial communications output and other future options, without changing the basic design of the present invention, giving the design a long life expectancy and diminishing its obsolescence. The aforementioned patents are herein incorporated in their entirety by reference. In this way, the present invention offers signal powered capabilities for most any signal capable of producing electrical energy at present limited to over 1 mW such as VAC Amps, Volts, Watts, Hertz, VDC & ADC to power the present invention. This versatility is a very critical requirement in the military and nuclear industry customer base, who require long life expectancies (>40 years) from any electronic instrument. The present invention replaces the over 200 year old analog meter technology responsible for so many tragedies caused by human-machine failures.

Figure 3:
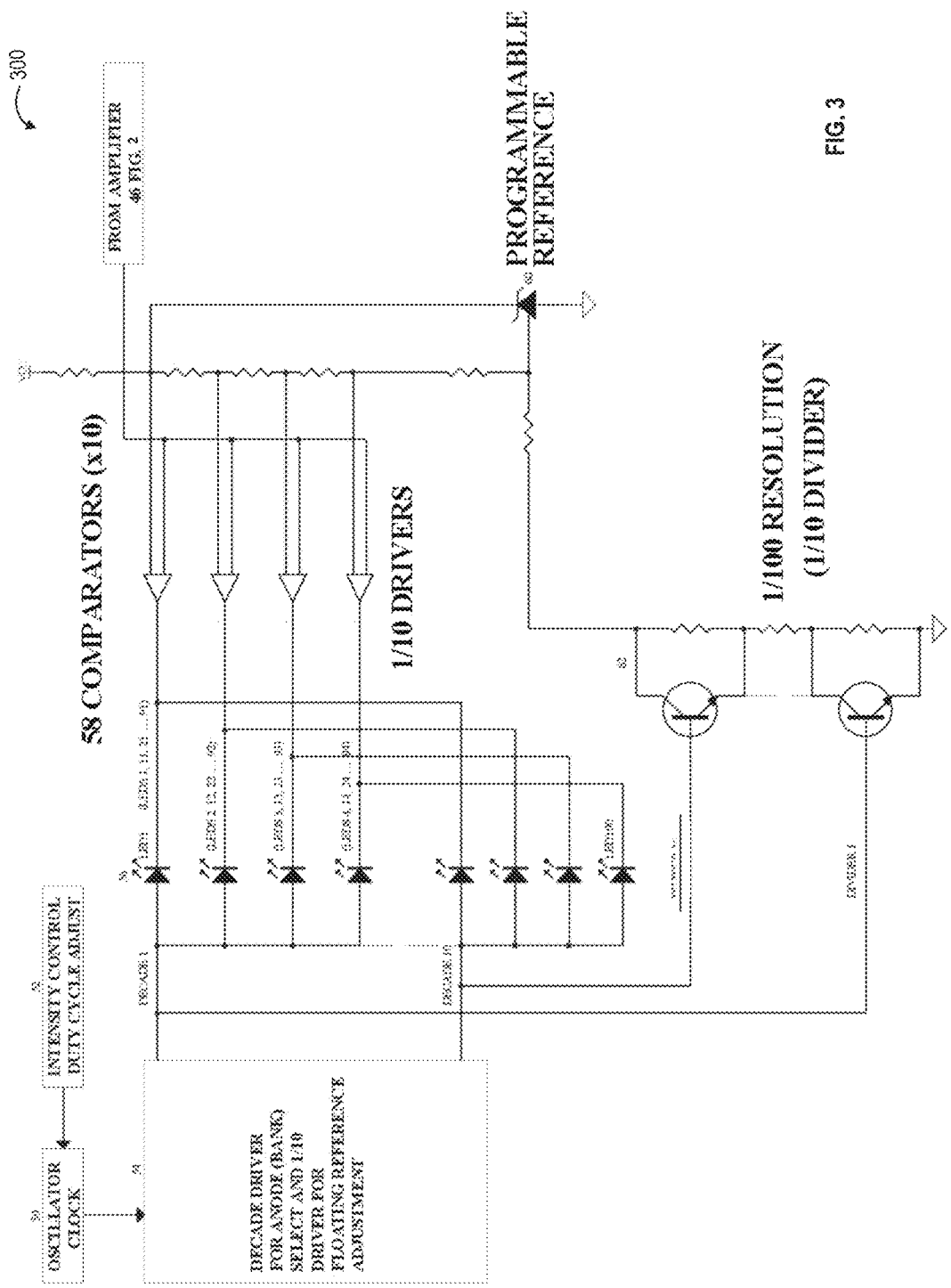
FIG. 3 shows a non-limiting embodiment of decade counter driven by an adjustable oscillator.

FIG. 3 depicts the state of the art of present invention by eliminating the need for a programmable device such as a microcontroller. FIG. 3 shows a comparator and driver circuit (300) comprising a comparator (58) and a driver (54), the comparator (58) configured to receive the voltage output and compare the voltage output with the Vcc across a plurality of light emitting diodes ("LEDs") (56). The driver (54) comprises multiple decade drivers, each decade driver configured to drive a decade of LEDs of the plurality of LEDs (56). The comparator compares the voltage output with Vcc, and wherein the comparing results in turning ON a portion of the plurality of LEDs. As such, a time for which the number of LEDs remain ON is determined by a duty cycle set by an oscillator (50) coupled to the driver (54). The portion of the plurality of LEDs that is turned ON is proportional to a signal strength of the input signal thereby effectively achieving intensity control of the signal meter. A total number of decade drivers and a total number of LEDs used in the meter (100) is determined based on the time and a visual light retention capability.

Thus, by using the generic decade counter (54) driven by the adjustable duty cycle oscillator (50) thru the potentiometer (52), the on-off time of the leds (56) is controlled, thereby eliminating the need for a microcontroller. In this way, the comparator and driver circuit (300) provides for a hardware-only design of the solid state analog meter or device (100) without digital assets, thus reducing cyber security hacking risks of the solid state analog device (100). The 100 leds are divided in groups of tens (decade) & driven by the ten (10) outputs of the decoder driver (54) thru their common anode connection. The same outputs of the decoder driver (54) are used to turn on shunting transistors (62) one at time to increase the sensitivity of the 10 comparators (58) to accomplish a $1/100$ (1%) resolution of the bargraph.

The above is possible by at the same time that a decade is selected, adjusting the reference output to allow the comparators (58) to compare the input signal to the automatic new value of the reference. The result is a 1 out of 100 (1%) resolution of the comparator compared to other devices that have less resolutions since the transistors (62) shunt to ground the reference value for the comparators and the reference simultaneously creating the optical illusion of continuity of the lit leds when actuality only one led is on at a given time (multiplexing) eliminating the need for programmable controllers and cyber security protection implementation & its added expense.

Figure 4:
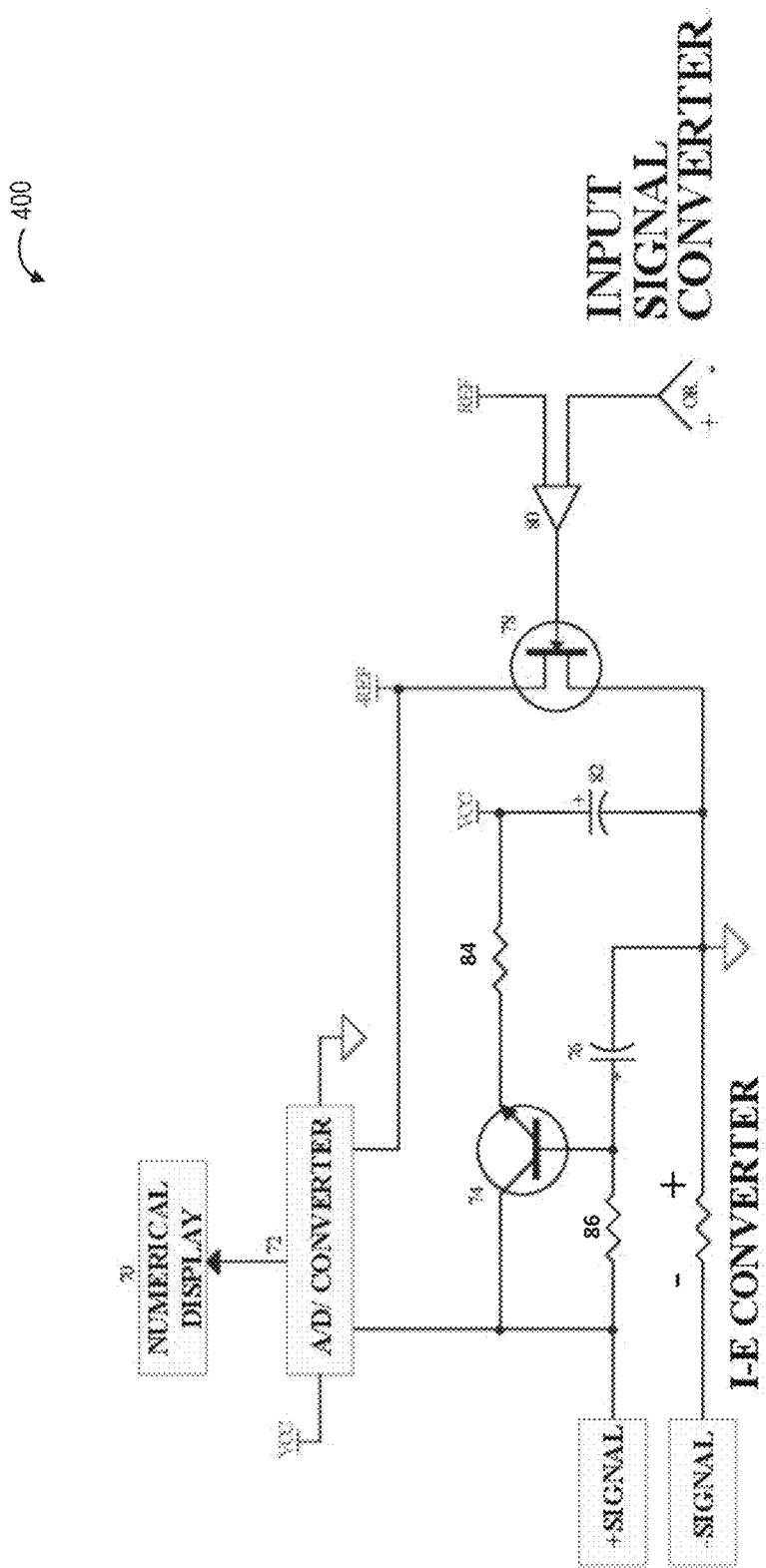
FIG. 4 shows the display that displays a signal fail.

The solid state analog device (100) functioning as a signal meter additionally includes a display (500) for displaying the signal strength of the input signal via a plurality of LEDs. The display (500) includes a numerical section or display (650) (shown in FIGS. 6A and 6B) coupled to a numerical display driver circuit (400) (shown in FIG. 4). Turning to FIG. 4, the numerical display driver circuit (400) is configured to automatically detect signal loss and provide an indication to a user and increase an ON time of the pilot light (28) when signal loss occurs via the numerical display (650). Herein, the numerical display (650) may a non-limiting example of the numerical display (70) shown in FIG. 4.

The numerical display driver circuit (400) comprises a comparator (80) configured to receive the signal input from the signal source (102) and compare the signal input to a reference voltage ("VREF"). The circuit (400) additionally includes a field effect transistor ("FET") (78) coupled to the second comparator (80), and an analog to digital (A/D) convertor (72) coupled to a numerical display (70). Herein, the second comparator (80) activates the FET (78) responsive to the signal input being lower than the VREF, wherein the activation of the FET (78) effectively disables the VREF input to the A/D converter (72) thereby display an error message on the numerical display (70) to intimate a user of the signal loss.

Thus, the numerical display driver circuit (400) provides an improved version of prior art U.S. Pat. No. 9,054,725 granted to inventor of the present invention to improve the on time of the alarm led (see item 28 in FIG. 1) and to visually alarm the user of the loss of input signal by using an off the shelf analog to digital (A/D) converter (72) driving an led numerical display (70) that has no serial communications or other means of manipulating the display other than forcing the A/D into an over-range condition. This is accomplished in the present invention by shorting out to ground the internal reference of the A/D (72) therefore displaying an illegal code on the digits (-----) indicating a malfunction, in this case the absence of input signal as detected by comparator (80) when the input signal drops below the value of the set reference at its positive (+) input by enabling FET (78) and forcing an over-range condition.

To increase the "on" time of the alarming condition the numerical display driver circuit (400) delays the power to the digital display driver of the A/D & internal circuitry while charging the super capacitor (82) via transistor (74) determined by capacitor (76).

Figure 5:
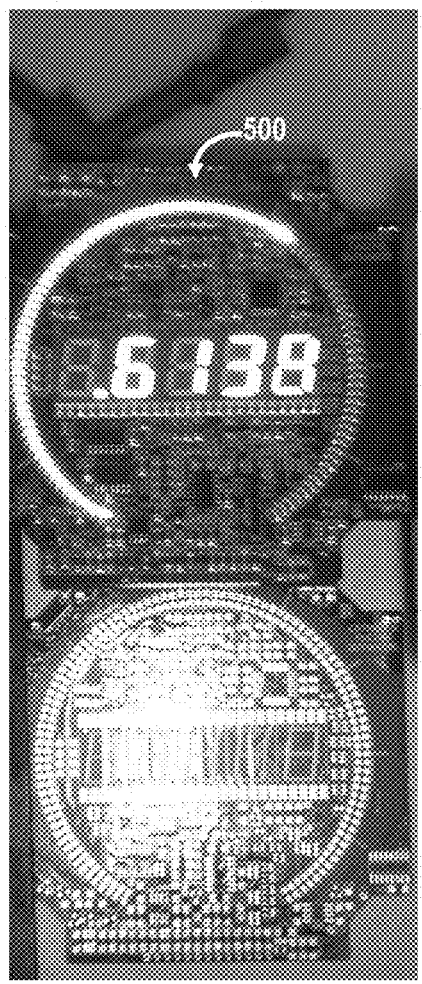
FIGS. 5, 6A, and 6B shows a front view of the display of the solid state analog meter.
Figure 6A:
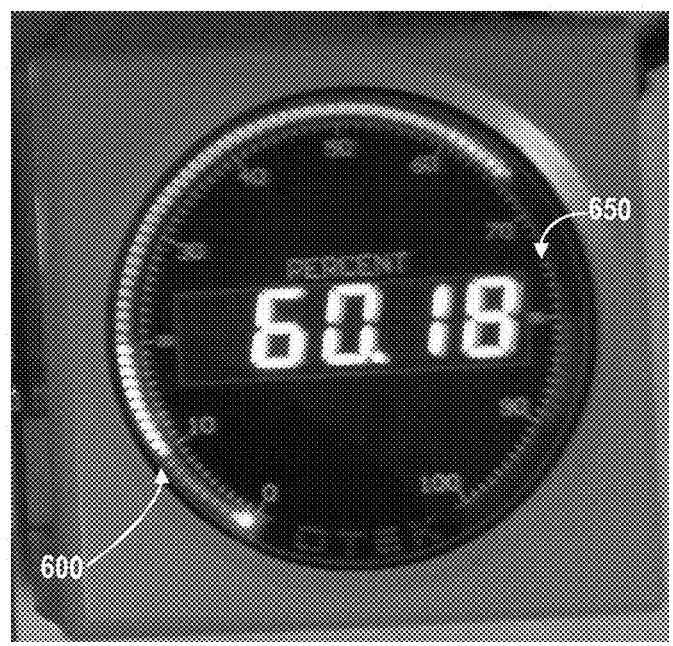
Figure 6B:
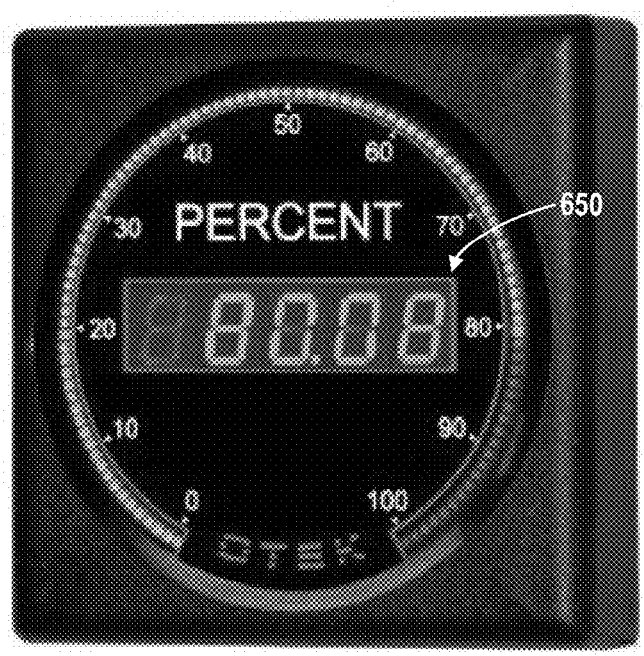

FIGS. 5, 6A, and 6B show pictures of the display of the solid state analog meter (100). The digital and analog portions of the display offers means of displaying different segmented colors on the all white led displays because of lack of microcontrollers, not allowed in cyber security digital devices such as the present invention requires. The plurality of LEDs are white LEDs (shown in FIG. 5) coupled to colored transparent filters, the colored transparent filters selected to convert the display into a color display (600)

(shown in FIG. 6A). The numerical display driver circuit (400) automatically detect signal loss and provide an indication to a user and increase an ON time of the pilot light (28) when signal loss occurs via the numerical section (650).

Since all the led used are pure white and to avoid expensive and time consuming customization of alarming colors such as in traffic lights, the present art uses a unique processing technique of producing multicolor translucent film to separate the sections as desired by the end user as depicted on by the photographs below making the appearance of individual colored segmented led.

Analog (Bargraph) Section:

The "signal powered" input signal conditioner covered under U.S. Pat. No. 9,054,725 granted to inventor of the present invention is improved in the present invention to allow for continuous illumination of a "zero" led during normal operation as well as if and when the signal fails, this along with the addition of solar cell and improved super capacitor increases the operating time of the "zero" led after signal or power failure eliminating the traditional "stuck needle" syndrome cause of tragedies for over two centuries.

The signal inversion (negative with respect to system ground) is converted to positive via the first amplifier (46) eliminating the need of a microcontroller, a dc-dc converter and differential amplifiers and allowing the comparators that drive the decade's via their cathodes to accept proper polarity signal after its zero and span adjustment as controlled by their respective variable resistors (potentiometers).

Elimination of the microprocessor due to governmental Cyber Security restrictions, required ingenious hardware only redesign of the automatic tricolor bargraph as well as led driving techniques to replace it with hardware only components. To accomplish this, the use of pure white led and a colored transparent filter with selected color to indicate safe, warning and dangerous zones was created such as but not limited to: green, yellow and red as per user's requirements.

The resolution of 1% (1 out of 100) of the bar was accomplished with a unique $1/100$ resolution driving scheme driven by the same decade counter that drives the led decades via their common anode connection but it drives the individual "shunting" transistors that drive the $1/10$ (0.1) resolution decoder ladder network giving a $1/10$ resolution to every decade being driven. The result is a minimum hardware (minimum power) requirement high resolution bargraph/pictorial representation of a mechanical needle (single pointer or continuous "fan") by using the voltage reference for both the decade and the unit drivers. Intensity adjustment & control of the bargraph (mandatory for "night vision" application is controlled by the duty cycle adjustment of the clock to control the "on" and "off" time of the decade driver outputs.

Numerical (Digital) Section:

The present art is an improvement over the prior art, U.S. Pat. No. 9,054,725 granted to inventor of the present invention that also utilizes its signal power innovation but it adds the automatic detection of absence of signal via amplifier that drives a field effect transistors (FET) for high of impedance that shunts the negative reference of the display driver forcing it to go into an "over-range" condition (because of lack of its reference) therefore displaying a single horizontal bar named segment "G" segment as an indication to the users of an anomaly in the display or over-range. To this and to prevent the display driver from wasting precious stored energy for the signal fail detector, a transistor controlled by a capacitor forms a delay to allow it to operate only and only when there is enough energy produced by the signal being measured. Again a solar cell is used as an additional energy producer to charge the super capacitor to drive the display during the absence of measurable signal.

The combination of bargraph and numerical display demands higher energy, therefore the present art includes methods of driving the bargraph and or the digital displays in parallel to the input signal (higher energy demand) or individually (in series) with the input signal utilizing the same amount of current available but at twice the burden (resistance) imposed unto it.

A signal powered metering device as shown of FIG. 1, that displays, controls, compares and transmits the value of the input signal and warns the user of the absence of the signal for extended period of time when compared to existing art (e.g., U.S. Pat. No. 9,054,725 granted to inventor of present invention) without the use of digital programmable devices (microcontroller) such as the one claimed on above mentioned patent number as to avoid criminal cyber security hacking, comprising of:

In another representation, the solid state analog meter of the present invention provides an improvement of the currently available signal powered meters by adding a solar cell (22), a pilot light (28), an inline inductor (14) for bidirectional noise protection resulting in longer indication of the proper operation of the metering device in the event that the input signal is absent. Herein, the inclusion of a inverting/non-inverting input signal amplifier eliminates the need for a differential amplifier and dc-dc converter that is needed for microcontrollers. In addition, the amplifier allows for selecting positive or negative inputs with respect to system's ground or signal return.

The present invention provides a hardware only circuitry that eliminates the need for programmable devices (microcontrollers) which can be criminally hacked to cause harm to the population and assets. The solid state analog meter includes extremely low power consumption as it is powered by the signal that it measures.

The present invention provides for a programmable clock oscillator (50) that controls the frequency & duty cycle of its output by adjustment of its variable resistor (52) that is used by present art to control the intensity & power consumption of its display. The decade counter/divider (54) has two functions: one to drive the banks of 10 (decade) leds (for a 100 segment bargraph) item (56) via their anode connection and two to simultaneously drive the shunting transistors (62) to achieve a $1/100$ (1%) resolution of the bargraph without the use of a microcontroller. The decade counter/divider (54) also simultaneously adjusts the variable reference (60) to extract a $1/100$ resolution from the signal to display it on the bargraph while the comparators (58) are being driven by the amplified/conditioned input signal of amplifier (46). This technique developed is responsible for the successful replacement of microcontroller eliminating excessive hardware and energy.

The present inventions provides a hardware only means of detecting the absence or out of limit status of the input signal to a) visually (70) warn the operator of a malfunction of the input signal by forcing the A/D (72) into an over-range condition without affecting its normal accuracy by using a FET (78) driven by comparator (80) for either positive (+) or negative (−) input signals as in signal powered mode. In addition, the present invention increases the storage time required by the storage super capacitor to power the "pilot led" while reducing the energy required by the display (70) without affecting its response time and accuracy.

The hardware-only design of the present invention additionally indicates the operator of within or out of limit condition of the signal by replacing the microcontroller with translucent colored filters overlapped in a customized manner to indicate safe, warning and dangerous regions of the signal being measure. The use of ultra white led allows the solid state analog meter of the present invention to ultimately eliminate the use of microcontrollers and reduce the power consumption to eliminate the analog meter technology.

As used herein, the term "about" refers to plus or minus 10% of the referenced number.

The disclosures of the following U.S. patents are incorporated in their entirety by reference herein: U.S. Pat. No. 9,054,725, U.S. Pat. No. 7,684,768, U.S. Pat. No. 7,626,378, U.S. Pat. No. 7,477,080, and U.S. Pat. No. 6,285,094.

Various modifications of the invention, in addition to those described herein, will be apparent to those skilled in the art from the foregoing description. Such modifications are also intended to fall within the scope of the appended claims. Each reference cited in the present application is incorporated herein by reference in its entirety.

Although there has been shown and described the preferred embodiment of the present invention, it will be readily apparent to those skilled in the art that modifications may be made thereto which do not exceed the scope of the appended claims. Therefore, the scope of the invention is only to be limited by the following claims. Reference numbers recited in the claims are exemplary and for ease of review by the patent office only, and are not limiting in any way. In some embodiments, the figures presented in this patent application are drawn to scale, including the angles, ratios of dimensions, etc. In some embodiments, the figures are representative only and the claims are not limited by the dimensions of the figures. In some embodiments, descriptions of the inventions described herein using the phrase "comprising" includes embodiments that could be described as "consisting of", and as such the written description requirement for claiming one or more embodiments of the present invention using the phrase "consisting of" is met.

The reference numbers recited in the below claims are solely for ease of examination of this patent application, and are exemplary, and are not intended in any way to limit the scope of the claims to the particular features having the corresponding reference numbers in the drawings.

What is claimed is:

1. A solid state analog device (100) resistant to cyber security hacking, comprising:
   a) a signal input circuit (200) configured to generate a voltage output and a reference power supply voltage ("Vcc") from an input signal, the signal input circuit configured to detect loss of the input signal, wherein the input signal is generated by a signal source (102) coupled to the solid state analog device (100);
   b) a comparator and driver circuit (300) comprising a first comparator (58) and a driver (54), the first comparator (58) configured to receive the voltage output and compare the voltage output with the Vcc across a plurality of light emitting diodes ("LEDs") (56), wherein the plurality of LEDs are driven by the driver (54), and wherein the comparing results in turning ON a number of LEDs of the plurality of LEDs, the number based on a strength of the input signal, and wherein a time the number of LEDs remain ON is determined by a duty cycle set by an oscillator (50) coupled to the driver (54) thereby generating an intensity control; and
   c) a display (500) for displaying the signal strength via the plurality of LEDs, wherein the comparator and driver circuit (300) provides for a hardware-only design of the solid state analog device (100) without digital asset thus reducing cyber security hacking risks.

2. The solid state analog meter of claim 1, wherein the signal input circuit (100) comprises:
   a) an inductor (14) coupled to the input signal, configured for bidirectional noise protection;
   b) a solar cell (22) coupled to a first diode (20), a first supercapacitor (24), and a pilot light (28), the solar cell (22) configured to drive a pilot light (28) when the input signal is below a threshold, and wherein the solar cells is further configured to charge the first supercapacitor (24) through the first diode (20); and
   c) the first supercapacitor (24) configured to receive energy from the solar cell (22) and store the energy, wherein the energy stored in the first supercapacitor (24) is configured to drive the pilot light (28) when the input signal fails, wherein the first diode (20) blocks the energy stored in the first supercapacitor (24) to be discharged through the solar cell (22).

3. The solid state analog meter of claim 1, wherein the signal input circuit (100) comprises an amplifier (46) configured to convert the input signal to the voltage output configured to drive the comparator and driver circuit (300).

4. The solid state analog meter of claim 1, wherein the signal input circuit (100) further comprises:
   a) a first resistor (18) coupled to the first supercapacitor (24) configured to provide additional charge to the supercapacitor (24);
   b) a second diode (16) coupled to the inductor (14) and the resistor (18), the second diode (16) configured block the energy stored in the first supercapacitor (24) to be discharged through the signal source (102);
   c) a voltage regulator (30) coupled in parallel to a capacitor (32), the voltage regulator (30) configured to shunt the signal input, wherein the capacitor (32) is configured to filter the signal input; and
   d) a second resistor (34) coupled to a third resistor (36), wherein a voltage developed at a junction of the second resistor (34) and the third resistor (36) becomes a negative signal input to the amplifier (46).

5. The solid state analog meter of claim 1, wherein the driver (54) comprises multiple decade drivers, each decade driver configured to a decade of LEDs, wherein the plurality of LEDs is divided into groups of ten LEDs forming the decade.

6. The solid state analog meter of claim 5, wherein a number of decade drivers and a number of LEDs used is determined based on the time that the LEDs are ON and a visual light retention capability.

7. The solid state analog meter of claim 1, wherein the plurality of LEDs are white LEDs coupled to colored transparent filters effective for generating a color display (600).

8. The solid state analog meter of claim 1, wherein the display further comprises a numerical section (650) coupled to a numerical display driver circuit (400).

9. The solid state analog meter of claim 8, wherein the numerical display driver circuit (400) is configured to automatically detect signal loss and provide an indication to a user and increase an ON time of the pilot light (28) when signal loss occurs.

10. The solid state analog meter of claim 8, wherein the numerical display driver circuit (400) comprises:

a) a second comparator (80) configured to receive the signal input from the signal source (102) and compare the signal input to a reference voltage ("$V_{REF}$");
b) a field effect transistor ("FET") (78) coupled to the second comparator (80); and
c) an analog to digital (A/D) convertor (72) coupled to a numerical display (70), wherein the second comparator (80) activates the FET (78) responsive to the signal input being lower than the $V_{REF}$, wherein the activation of the FET (78) effectively disables the $V_{REF}$ input to the A/D converter (72) thereby display an error message on the numerical display (70) to intimate a user of the signal loss.

* * * * *